(12) United States Patent
Ohsumi et al.

(10) Patent No.: US 7,540,082 B2
(45) Date of Patent: Jun. 2, 2009

(54) METHOD FOR MANUFACTURING PRINTED WIRING BOARD

(75) Inventors: Kohichi Ohsumi, Shiga (JP); Kaoru Kobayashi, Shiga (JP)

(73) Assignee: International Business Machines Corporation, Armonk, NY (US)

(*) Notice: Subject to any disclaimer, the term of this patent is extended or adjusted under 35 U.S.C. 154(b) by 125 days.

(21) Appl. No.: 10/595,127

(22) PCT Filed: Aug. 19, 2004

(86) PCT No.: PCT/JP2004/011885

§ 371 (c)(1),
(2), (4) Date: Dec. 19, 2006

(87) PCT Pub. No.: WO2005/022970

PCT Pub. Date: Mar. 10, 2005

(65) Prior Publication Data

US 2007/0124929 A1 Jun. 7, 2007

(30) Foreign Application Priority Data

Aug. 28, 2003 (JP) ............................ 2003-305527

(51) Int. Cl.
*H01K 3/10* (2006.01)
*H05K 1/03* (2006.01)
(52) U.S. Cl. .................... 29/852; 29/846; 174/255; 174/264; 174/266
(58) Field of Classification Search .................. 29/846, 29/852; 174/255, 264, 266
See application file for complete search history.

(56) References Cited

U.S. PATENT DOCUMENTS

| 6,225,031 | B1 | 5/2001 | Appelt et al. |
| 6,426,011 | B1 | 7/2002 | Katoh |
| 6,662,442 | B1 * | 12/2003 | Matsui et al. ................. 29/852 |
| 6,930,258 | B1 * | 8/2005 | Kawasaki et al. ........... 174/264 |

(Continued)

FOREIGN PATENT DOCUMENTS

JP 6-275959 A 9/1994

(Continued)

OTHER PUBLICATIONS

European Search Report, Sep. 18, 2008, JP920030157EP1, 04771846.5-1235/1662850, PCT/JP2004011885.

*Primary Examiner*—C. J Arbes
(74) *Attorney, Agent, or Firm*—Anthony J. Canale

(57) ABSTRACT

A printed wiring board having a through hole conductor formed on the surface of a through hole formed in a copper-clad laminate board, and on the surface of the copper-clad laminate board 1 in the vicinity of an opening of the through hole. The through hole conductor is filled with a positive photosensitive resin. A capped conductor is formed on the positive photosensitive resin and is coupled to the through hole conductor. Further, a circuit pattern is formed on the surface of the copper-clad laminate board. An insulating layer is formed on the surface of the copper-clad laminate board, capped conductor, and the circuit pattern, and formed with a via hole extending from the surface of the insulating layer to the capped conductor. A via conductor is formed inside the via hole and on the surface of the insulating layer in the vicinity of an opening of the via hole.

13 Claims, 16 Drawing Sheets

U.S. PATENT DOCUMENTS

| | | | |
|---|---|---|---|
| 7,178,234 B2 * | 2/2007 | Kawasaki et al. | 29/852 |
| 2001/0025414 A1 * | 10/2001 | Toyoshima et al. | 29/852 |
| 2004/0154163 A1 * | 8/2004 | Miyazaki et al. | 29/832 |
| 2005/0189136 A1 * | 9/2005 | Kawasaki et al. | 174/255 |
| 2007/0175025 A1 * | 8/2007 | Tsukamoto et al. | 29/832 |

FOREIGN PATENT DOCUMENTS

| | | |
|---|---|---|
| JP | 6-302963 A | 10/1994 |
| JP | PUPA 06-302963 A | 10/1994 |
| JP | 9-312459 A | 12/1997 |
| JP | PUPA 09-312459 A | 12/1997 |
| JP | 11-68297 A | 3/1999 |
| JP | A-H11-274730 | 10/1999 |
| JP | A-2001-291956 | 10/2001 |

* cited by examiner

METHOD FOR MANUFACTURING PRINTED WIRING BOARD

FIELD OF THE INVENTION

The present invention relates to a method of manufacturing a printed wiring board and, more specifically, relates to a method of manufacturing a printed wiring board having a through hole conductor.

BACKGROUND

In recent years, following the conductor pad pitch narrowing of integrated circuit (IC) chips, high density mounting on printed wiring boards has been advanced. Referring to FIG. 44A, a via conductor 50 is formed so as to cover a resin 60 and be coupled to an annular portion 511 of a through hole conductor 51. Assuming that an inner diameter of the through hole conductor 51 is D51 and a via diameter of the via conductor 50 is D50, the via conductor 50 is formed to establish a relationship of D50 is greater than D51. This is for connecting the via conductor 50 to the through hole conductor 51 to achieve electrical continuity therebetween.

For high density mounting on printed wiring boards, it is preferable to reduce the size of the inner diameter D51 of the through hole conductor 51 and the via diameter D50 of the via conductor 50. A reduction in the diameter of the via conductor 50 is possible, but a reduction in the diameter of the through hole conductor 51 is difficult to accomplish. Therefore, based on the fact that it is difficult to reduce the inner diameter D51 of the through hole conductor 51, but is possible to reduce the via diameter D50 of the via conductor 50, a via conductor 50 satisfying a relationship of D50 is less than D51 can be formed as shown in FIG. 44B. The reduction in the diameter of the via conductor 50 enables high density mounting on the printed wiring board. In this case, however, the via conductor 50 is not coupled to the through hole conductor 51, and therefore, no electrical continuity is achieved therebetween.

As a method for solving the foregoing problem, FIG. 44C shows a method of forming a capped conductor (plating) 52 covering the resin 60 and coupled to the annular portion 511 of the through hole conductor 51, and further forming the via conductor 50 on capped conductor 52. In this case, even if D50 is less than D51, the via conductor 50 is electrically coupled to the through hole conductor 51 via capped conductor 52. Consequently, the via conductor 50 can be reduced in size to thereby enable high density mounting on the printed wiring board.

However, the production of the printed wiring board having capped conductor 52 includes, after forming the through hole conductor 51 in a through hole 400, processes of filling the through hole 400 where the through hole conductor 51 is formed with the resin 60, and then forming capped conductor 52. Therefore, the following problems arise.

(1) When the through hole where the through hole conductor is formed is filled with a thermosetting resin in the form of a film using the lamination method, an unnecessary part of the resin can not be removed.

Generally, the filling of resin into the through hole where the through hole conductor is formed is carried out using a screen printing method or lamination method. However, when manufacturing the printed wiring board having a capped conductor, the filling of resin by the lamination method can not be employed. As shown in FIG. 45, in the lamination method, a process of filling the through hole 400 where the through hole conductor 51 is formed with the resin 60, and a process of forming a resin layer 80 on the surface of a base substrate 70 are simultaneously carried out. Therefore, the resin layer 80 is formed so as to cover the through hole conductor 51, and consequently, a capped conductor can not be formed.

(2) When performing the filling of resin by the screen printing method, it is not possible to carry out circuit pattern formation using the additive method.

In the case of filling of resin into the through hole where the through hole conductor is formed is implemented by the screen printing method, when the circuit pattern formation is carried out using the additive method, a process of plating the surface of the through hole 400 with copper to form the through hole conductor 51 and a process of forming a circuit pattern 90 are simultaneously carried out as shown in FIG. 46A. Subsequently, as shown in FIG. 46B, the through hole 400 where the through hole conductor 51 is formed is filled with the resin 60 by the screen printing method. After the filling and drying, as shown in FIG. 46C, part of the resin 60 projecting from the surface of the annular portion 511 of the through hole conductor 51 is abraded using a belt sander or the like. Upon abrasion, it is difficult to abrade only the resin over the surface of the annular portion 511, and therefore, the circuit pattern 90 formed in the vicinity of an opening of the through hole conductor 51 is also abraded by the belt sander resulting in damage to the circuit pattern 90. Consequently, when the filling of resin is implemented by the screen printing method, the circuit pattern formation by the additive method can not be carried out.

(3) When performing the filling of resin by the screen printing method, the accuracy of a circuit pattern can not be ensured if the circuit pattern formation is carried out by the subtractive method.

In the case of filling of resin into the through hole where the through hole conductor is formed is implemented by the screen printing method, when the circuit pattern formation is carried out using the subtractive method, having a copper foil 72 on the surface and formed with a through hole 73 is first prepared as shown in FIG. 47A. Then, as shown in FIG. 47B, a copper plating layer 74 is formed on the surface of the through hole 73 and the surface of the copper foil 72. In this event, the copper plating layer 74 formed on the surface of the through hole 73 assumes a cylindrical shape. Further, the through hole 73 where the copper plating layer 74 is formed is filled with the resin 60 by the screen printing method and, after drying, the resin 60 is abraded. After the abrasion, a copper plating layer 75 is formed on the resin 60 and the copper plating layer 74 as shown in FIG. 47C. After forming the copper plating layer 75, a circuit pattern 90 is formed by the subtractive method as shown in FIG. 47D. Simultaneously, the through hole conductor 51 and capped conductor 52 are also formed.

Inasmuch as the circuit pattern 90 is formed through the foregoing processes, it is composed of three layers having the copper foil 72, the copper plating layer 74, and the copper plating layer 75. As a result, the thickness of the circuit pattern 90 can not be made thin. If a thickness T of the circuit pattern 90 is large, the circuit pattern 90 assumes a trapezoidal shape in cross-section as shown in FIG. 47D, so that the accuracy of its shape can not be ensured and formation of a fine circuit pattern is prevented.

(4) capped conductor (plating) can not be formed having a relatively thick thickness.

In the case of implementing the filling of resin by the screen printing method, when the circuit pattern formation is carried out by the subtractive method, the circuit pattern 90 should be formed having a thin thickness as described above. Therefore, capped conductor 52 in the form of the copper plating layer 75 can not be formed thick. Consequently, deformation caused by differences in thermal expansion coefficients among the resin 60, the through hole conductor 51, and the base substrate 71 exerts an influence on a via conductor (not illustrated) formed on capped conductor 52.

SUMMARY OF THE INVENTION

It is an aspect of the present invention to provide a method of manufacturing a printed wiring board having a through hole conductor which can be manufactured using any one of various circuit pattern forming methods such as, for example, an additive method or a subtractive method.

It is another aspect of the present invention to provide a method of manufacturing a printed wiring board which can ensure accuracy of a circuit pattern.

It is still another aspect of the present invention to provide a method of manufacturing a printed wiring board capable of reducing an influence of deformation that is exerted on a via conductor.

A method of manufacturing a printed wiring board according to the present invention comprises the steps of providing a base substrate; forming a through hole in the base substrate; forming a through hole conductor on a surface of the through hole and a surface of the base substrate in the vicinity of an opening of the through hole; filling the through hole where the through hole conductor is formed with a photosensitive resin (e.g. positive photosensitive resin) and forming the photosensitive resin on the opening of the through hole where the through hole conductor is formed and on a surface of the base substrate at least in the vicinity of the opening; exposing the photosensitive resin to electromagnetic radiation (e.g. light, ultraviolet light) from above the base substrate and developing the photosensitive resin; and forming a capped conductor after developing the photosensitive resin, the capped conductor covering the photosensitive resin filled inside the through hole and the capped conductor coupled to the through hole conductor.

Conventionally, when a through hole where a through hole conductor is formed is filled with a resin using the screen printing method, part of the resin forms over the through hole where the through hole conductor is formed, and therefore, the part of the resin formed over the through hole (namely, an unnecessary insulating material) needs to be abraded away. In the printed wiring board according to the present invention, the positive photosensitive resin is used as a resin filled inside the through hole where the through hole conductor is formed. Therefore, an unnecessary part of the positive photosensitive resin can be easily removed by filling the through hole where the through hole conductor is formed with the positive photosensitive resin and forming the positive photosensitive resin on the opening of the through hole where the through hole conductor is formed and on the surface of the base substrate at least in the vicinity of the opening by the use of the screen printing method, and exposing and developing the positive photosensitive resin. Therefore, the abrading process can be omitted. Consequently, a circuit pattern can be formed by the additive method that conventionally could not be used due to the necessity of the abrading process. Furthermore, conventionally, when a through hole where a through hole conductor is formed is filled with a resin using the lamination method, a resin layer is also formed on the base substrate, thereby disabling formation of a capped conductor (plating) on the through hole conductor. In the printed wiring board according to the present invention, although a positive photosensitive resin layer is formed so as to cover the through hole conductor using the lamination method, an unnecessary part of the positive photosensitive resin layer covering the through hole conductor can be easily removed by the exposure and development. Therefore, it is also possible to select the lamination method as a method of filling the through hole where the through hole conductor is formed with the resin. Accordingly, in the printed wiring board according to the present invention, the through hole where the through hole conductor is formed can be filled with the resin by either the screen printing method or the lamination method, and the circuit pattern can be formed either by the subtractive method or the additive method. Incidentally, if the circuit pattern is formed by the additive method, the accuracy of its shape can be ensured.

Preferably, the step of exposing exposes, after exposing the positive photosensitive resin, the positive photosensitive resin using a photomask that shields the opening of the through hole from the light.

In this event, the part of the positive photosensitive resin formed over the through hole where the through hole conductor is formed is exposed to the light by the initial exposure. Then, the exposure is carried out using the photomask that shields the opening of the through hole from the light. As a result, the unnecessary part of the positive photosensitive resin is exposed so as to be easily removed.

Preferably, the step of forming a through hole conductor comprises the steps of forming a photoresist on the surface of the base substrate except the surface of the through hole and the surface of the base substrate in the vicinity of the opening of the through hole; forming the through hole conductor by plating on the surface of the through hole and the surface of the base substrate in the vicinity of the opening of the through hole; and removing the photoresist after forming the through hole conductor by plating. The manufacturing method further comprises a step of forming a circuit pattern on the surface of the base substrate after developing the positive photosensitive resin.

Conventionally, when forming the through hole conductor by plating, a plating layer that becomes part of the circuit pattern is also formed on the base substrate, and therefore, the circuit pattern is relatively thick. On the other hand, in the present invention, when forming the through hole conductor by plating, the resist is formed on the base substrate so that the plating layer that becomes part of the circuit pattern is not formed on the base substrate. The circuit pattern is formed in a subsequent step. Therefore, the circuit pattern can be formed to be thinner than the circuit pattern produced by the conventional method. Accordingly, even if the circuit pattern is formed by the subtractive method, the accuracy of its shape can be ensured and the formation of a fine circuit pattern is made possible.

Preferably, the step of forming a circuit pattern is carried out simultaneously with the step of forming the capped conductor.

Preferably, the manufacturing method according to the present invention further comprises the steps of forming an insulating layer on the surface of the base substrate so as to cover the capped conductor; forming a via hole in the insulating layer, the via hole extending to reach the capped conductor; and forming a via conductor covering a surface of the insulating layer at least in the vicinity of an opening of the via hole and coupled to the capped conductor.

Conventionally, when a circuit pattern is formed by the subtractive method, the circuit pattern includes a first conductor and a second conductor formed on the first conductor. The first conductor is the same layer as the through hole conductor, while the second conductor is the same layer as the capped conductor. Inasmuch as the conventional circuit pattern includes the two conductors, it has been difficult to achieve a reduced thickness of the circuit pattern. In the manufacturing method for the printed wiring board according to the present invention, although the circuit pattern includes the second conductor being the same layer as the capped conductor, it does not include the first conductor being the same layer as the through hole conductor. As a result, the circuit pattern according to the present invention can be formed thinner than the conventional circuit pattern.

Further, inasmuch as the conventional circuit pattern includes the first and second conductors, the first and second conductors should be reduced in thickness for forming a thin circuit pattern. Therefore, the capped conductor being the same layer as the second conductor should also be formed thin. In the manufacturing method for the printed wiring board according to the present invention, the circuit pattern does not include the first conductor. Accordingly, even if the second conductor is formed thicker compared to the conventional second conductor, the circuit pattern of the present invention can still be formed thinner than the conventional circuit pattern. To this end, the capped conductor of the present invention can be formed thicker than the conventional capped conductor. In the printed wiring board, deformation is caused by differences in the thermal expansion coefficients among the through hole conductor, the resin filled inside the through hole where the through hole conductor is formed, and the base substrate. However, by increasing the thickness of the capped conductor, an influence of the deformation exerted on the via conductor can be relaxed.

DETAILED DESCRIPTION OF THE INVENTION

Figure 1:
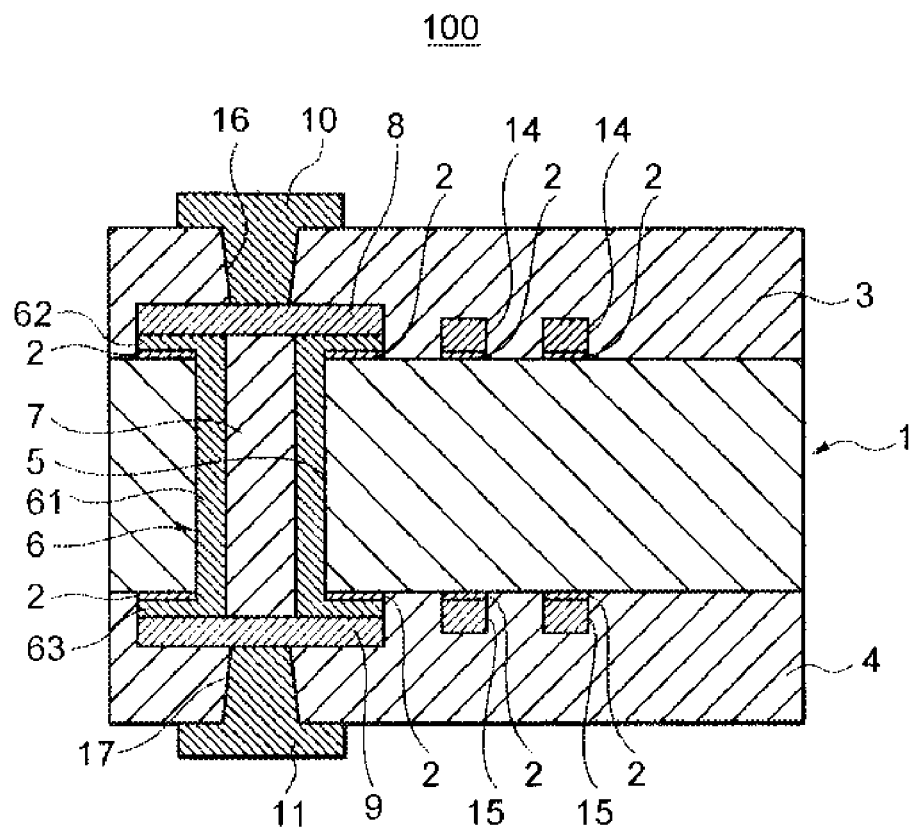
FIG. 1 is a sectional view showing a structure of a printed wiring board according to an embodiment of the present invention.

Hereinbelow, embodiments of the present invention will be described in detail with reference to the drawings. The same or corresponding portions are assigned the same reference numerals in the figures to thereby avoid repetition of description thereof.

FIG. 1 is a sectional view showing a structure of a printed wiring board 100 according to an embodiment of the present invention. Referring to FIG. 1, the printed wiring board 100 comprises a copper-clad laminate board 1 with upper and lower copper foils 2 attached thereon, an insulating layer 3 formed on an upper surface of the copper-clad laminate board 1, and an insulating layer 4 formed on a lower surface of the copper-clad laminate board 1.

The copper-clad laminate board 1 is formed with a through hole 5 leading from its upper surface to its lower surface. A through hole conductor 6 is formed on a surface of the through hole 5 and on the upper and lower surfaces of the copper-clad laminate board 1 in the vicinity of upper and lower openings of the through hole 5. The through hole conductor 6 is formed by copper plating.

The through hole conductor 6 comprises a cylindrical portion 61 formed on the surface of the through hole 5, an annular portion 62 formed on the upper copper foil 2 of the copper-clad laminate board 1 in the vicinity of the upper opening of the through hole 5, and an annular portion 63 formed on the lower copper foil 2 of the copper-clad laminate board 1 in the vicinity of the lower opening of the through hole 5. The cylindrical portion 61 and the annular portions 62 and 63 are smoothly joined together to be unified.

A positive photosensitive resin 7 is filled inside the through hole 5 where the through hole conductor 6 is formed, i.e. inside the cylindrical portion 61 of the through hole conductor 6. On the upper side of the copper-clad laminate board 1, a capped conductor 8 covering the positive photosensitive resin 7 and coupled to the annular portion 62 is formed by copper plating. Also on the lower side of the copper-clad laminate board 1, a capped conductor 9 covering the positive photosensitive resin 7 and coupled to the annular portion 63 is formed by copper plating in the same manner as capped conductor 8.

A circuit pattern 14 is formed on the upper surface of the copper-clad laminate board 1. The circuit pattern 14 is formed from the same layer of copper as capped conductor 8 and is formed on the upper copper foil 2 of the copper-clad laminate board 1. In the same manner, a circuit pattern 15 is formed on the lower surface of the copper-clad laminate board 1. The circuit pattern 15 is formed from the same layer of copper as capped conductor 9 and is formed on the lower copper foil 2 of the copper-clad laminate board 1. The circuit patterns 14 and 15 are formed by copper plating. It is to be noted that a conductor which is the same layer as the through hole conductor 6 does not exist between the copper foil 2 and each of the circuit patterns 14 and 15, and therefore, the circuit patterns 14 and 15 are formed directly on the copper foils 2.

The insulating layer 3 is formed so as to cover capped conductor 8 and the circuit pattern 14. The insulating layer 3 is formed with a via hole 16 located directly above the through hole 5 and extending from the surface of the insulating layer 3 to reach capped conductor 8. A via conductor 10 is formed inside the via hole 16 and on the surface of the insulating layer 3 in the vicinity of an opening of the via hole 16. In the same manner, the insulating layer 4 is formed so as to cover capped conductor 9 and the circuit pattern 15. The insulating layer 4 is formed with a via hole 17 located directly below the through hole 5 and extending from the surface of the insulating layer 4 to reach capped conductor 9. A via conductor 11 is formed inside the via hole 17 and on the surface of the insulating layer 4 in the vicinity of an opening of the via hole 17.

Although not illustrated, a plurality of circuit patterns may be formed on the surface of the insulating layer 3 and on the surface of the insulating layer 4. Although one through hole conductor 6 is exemplarily illustrated in FIG. 1, a plurality of through hole conductors 6 may be provided.

Description will be made of a method of manufacturing the printed wiring board 100 having the foregoing structure.

FIGS. 2 to 21 are sectional views showing manufacturing processes of the printed wiring board 100 shown in FIG. 1, wherein the circuit patterns 14 and 15 are formed by the subtractive method.

Figure 2:
FIGS. 2-21 are sectional views showing a first process in a manufacturing method for the printed wiring board shown in FIG. 1.
Figure 3:
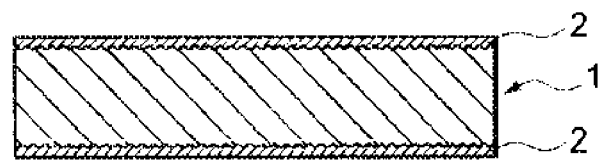
Figure 4:
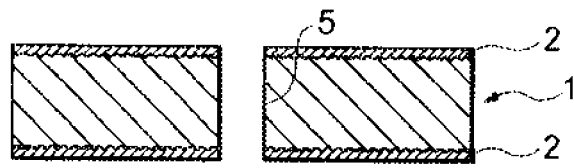
Figure 5:
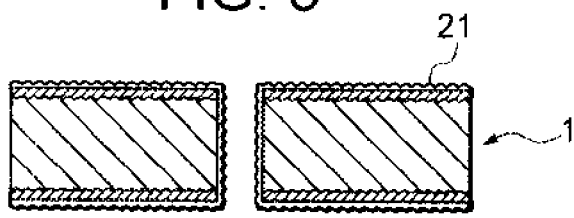

Referring to FIG. 2, the copper-clad laminate board 1 is made of, for example, a glass epoxy resin material, and the copper foils 2 are attached on the surfaces thereof. In this event, a thickness of each copper foil 2 is about 12 µm. As shown in FIG. 3, the thickness of each copper foil 2 is reduced to about 3.3 µm by etching in a copper chloride solution. Subsequently, as shown in FIG. 4, the through hole 5 is formed by a mechanical drilling process or a laser drilling process. After forming the through hole 5, swelling and permanganic acid treatment are carried out to smooth the surface of the through hole 5. After the swelling and permanganic acid treatment, copper oxide on the surface of each copper foil 2 is removed by soft etching and, as shown in FIG. 5, an electroless copper plating layer 21 is formed on the surface of the through hole 5 and the upper and lower surfaces of the copper-clad laminate board 1 by electroless copper plating. The electroless copper plating layer 21 is for forming a thick copper plating layer by electrolytic copper plating which will be described below.

Figure 6:
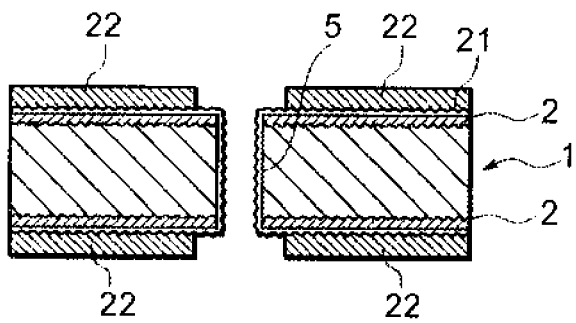
Figure 7:
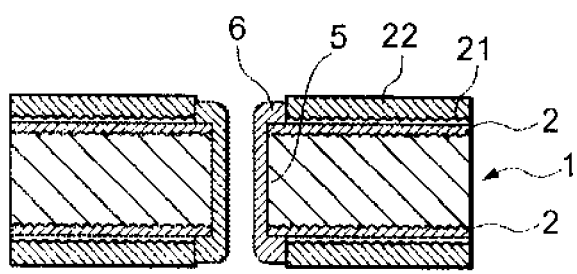
Figure 8:
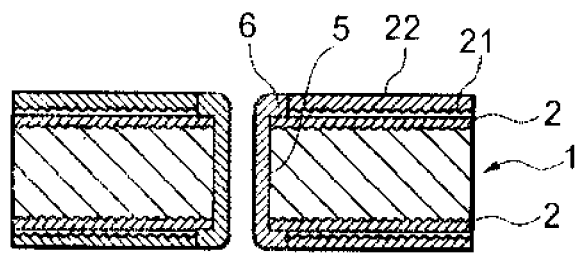
Figure 9:
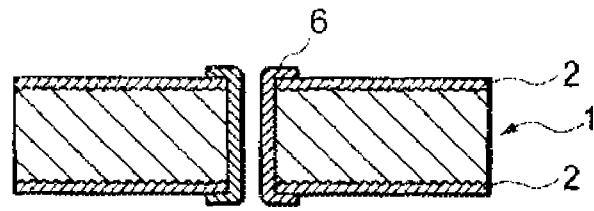
Figure 47A:
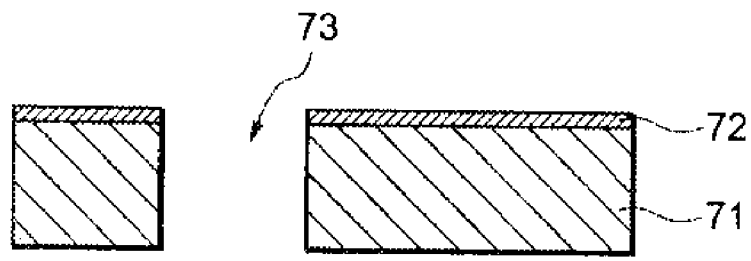
FIGS. 47A to 47D are sectional views showing manufacturing processes of a printed wiring board when forming a circuit pattern using the subtractive method in the case when a through hole is filled with a resin by the screen printing method.
Figure 47B:
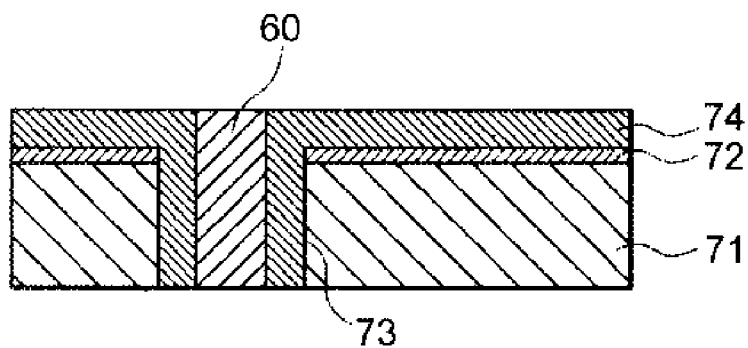
Figure 47C:
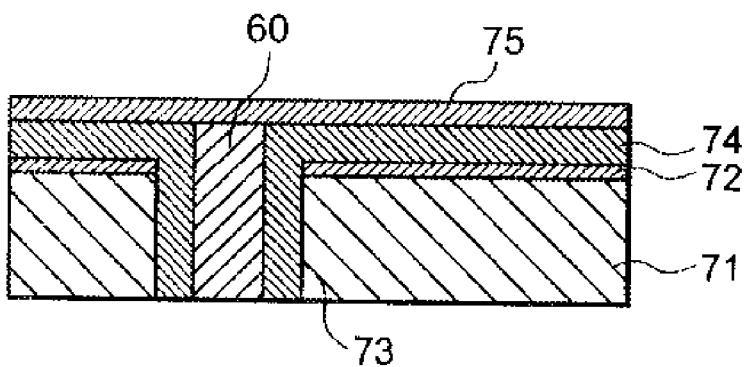
Figure 47D:
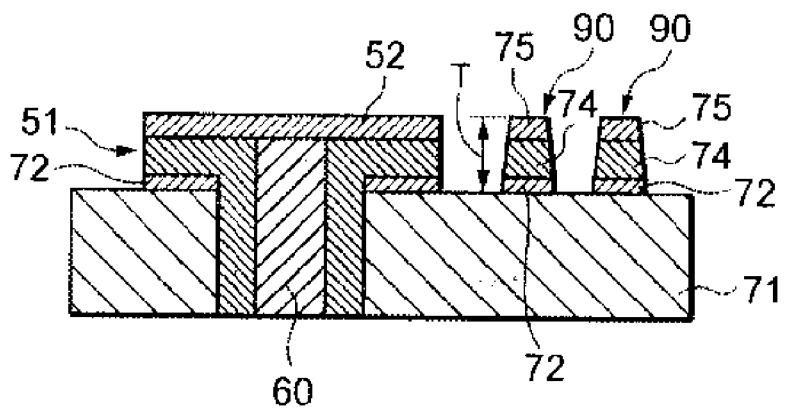

After forming the electroless copper plating layer 21 on the surfaces of the copper-clad laminate board 1 and the surface of the through hole 5, photoresists 22 are formed by exposure and development using negative alkaline development photoresists as shown in FIG. 6. Specifically, the photoresists are applied to the upper and lower surfaces of the copper-clad laminate board 1 and each exposed to ultraviolet light using a photomask (not illustrated). The intensity of ultraviolet light is, for example, about 200 mJ/cm$^2$. After the exposure, development is carried out to form the photoresists 22 on the surfaces of the copper-clad laminate board 1 except the surface of the through hole 5 and the surfaces of the copper-clad laminate board 1 in the vicinity of the openings of the through hole 5. As a developer, a sodium carbonate aqueous solution is used. After forming the photoresists 22, as shown in FIG. 7, the copper plating through hole conductor 6 is formed on the surface of the through hole 5 and the upper and lower surfaces of the copper-clad laminate board 1 in the vicinity of the openings of the through hole 5 by electrolytic copper plating. Incidentally, in the figures subsequent to FIG. 7 inclusive, the electroless copper plating layer 21 formed on the surface of the through hole 5 is omitted. After forming the through hole conductor 6, as shown in FIG. 8, the surfaces of the photoresists 22 and the surfaces of the annular portions 62 and 63 of the through hole conductor 6 are abraded using a belt sander. This is for adjusting a thickness of each of the annular portions 62 and 63 of the through hole conductor 6. After the abrasion, the photoresists 22 are removed as shown in FIG. 9 using a sodium hydroxide aqueous solution. Further, an oxidation treatment process is applied to the surface of the through hole conductor 6. Through the foregoing processes, the through hole conductor 6 is formed. Conventionally, when the circuit pattern is formed by the subtractive method, the circuit pattern 90 includes the copper plating layer 74 and the copper plating layer 75 formed on the copper plating layer 74 as shown in FIG. 47D. Herein, the copper plating layer 74 is the same layer as the through hole conductor 51 and is formed simultaneously with the through hole conductor 51. Consequently, inasmuch as the conventional circuit pattern includes the two copper plating layers 74 and 75, it has been difficult to achieve a reduced thickness of the circuit pattern. According to the present invention, in the processes for the formation of the through hole conductor 6, only the through hole conductor 6 is formed using the photoresists 22, and therefore, a copper plating layer corresponding to the copper plating layer 74 forming the conventional circuit pattern 90 is not formed. Therefore, the circuit pattern of the present invention can be formed to be thinner than the conventional circuit pattern, as will be described later.

Figure 10:
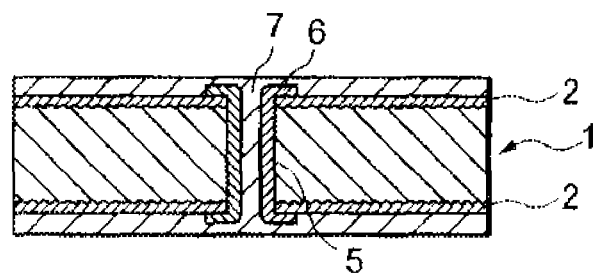

Subsequently, as shown in FIG. 10, the through hole 5 where the through hole conductor 6 is formed is filled with the positive photosensitive resin 7, and further, the positive photosensitive resin 7 is formed on the openings of the through hole 5 and the surfaces of the copper-clad laminate board 1 in the vicinity of the openings of the through hole 5. In this event, the positive photosensitive resin 7 may be formed by either the screen printing method or the lamination method.

Figure 11:
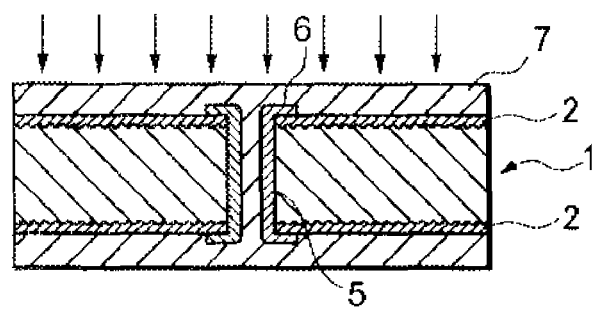
Figure 12:
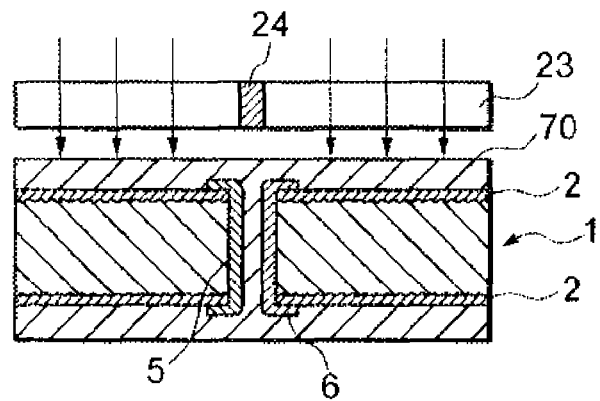
Figure 13:
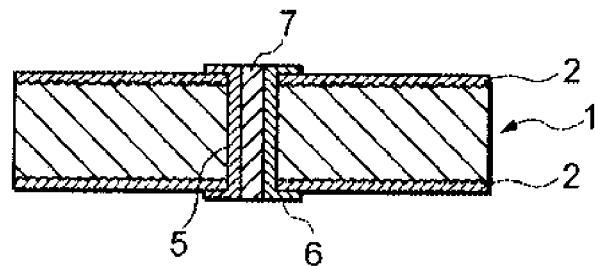

Of the positive photosensitive resin 7 formed in FIG. 10, the part formed on the openings of the through hole 5 and the surfaces of the copper-clad laminate board 1 in the vicinity of the openings of the through hole 5 is unnecessary and thus should be removed. Therefore, as shown in FIGS. 11 to 13, the unnecessary part of the positive photosensitive resin 7 is removed by exposure and development. Since processing of the exposure and development is the same on each of the upper and lower sides of the copper-clad laminate board 1, the processing only on the upper side will be described. First, as shown in FIG. 11, the positive photosensitive resin 7 formed on the opening of the through hole 5 and the surface of the copper-clad laminate board 1 in the vicinity of the opening thereof is exposed to ultraviolet light. In this event, the intensity of ultraviolet light is, for example, about 500 mJ/cm$^2$. Then, as shown in FIG. 12, the positive photosensitive resin 7 is exposed to ultraviolet light using a photomask 23. The photomask 23 is fixed directly above the positive photosensitive resin 7 and allows ultraviolet light radiated from above the photomask 23 to pass therethrough. However, a region 24 in the photomask 23, where the positive photosensitive resin 7 filled inside the through hole 5 is located directly below, serves to shield the ultraviolet light. This is for preventing the positive photosensitive resin 7 filled inside the through hole 5 from being exposed to the ultraviolet light during the exposure. Therefore, when the exposure is carried out using the photomask 23, the part of the positive photosensitive resin 7 filled inside the through hole 5 is not exposed, but the other part of the photosensitive resin 7 thereof is exposed. In this event, the intensity of ultraviolet light is, for example, about 1000 mJ/cm$^2$.

After the exposure, the photoresist development is carried out as shown in FIG. 13. The exposed part of the positive photosensitive resin 7 is removed by the development. Therefore, the positive photosensitive resin 7 is removed by the development except the part thereof filled inside the through hole 5. As a developer, a solvent type developer, for example, is used. After the development, the positive photosensitive resin 7 filled inside the through hole 5 is heat-cured. The condition of heat curing is, for example, about 60 minutes in an atmosphere at a temperature of about 170° C.

In this embodiment, through the foregoing processes, even when the through hole 5 where the through hole conductor 6 is formed is filled with the resin by the lamination method, the unnecessary resin can be easily removed by the exposure and development processes. This also applies to the case where the filling of resin is carried out by the screen printing method.

Figure 14:
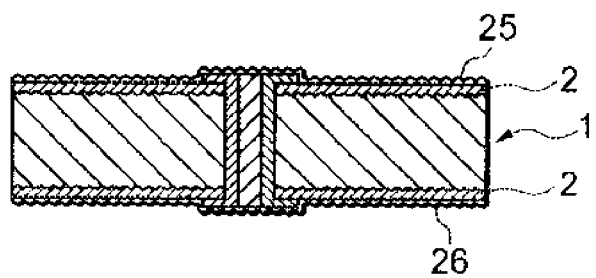
Figure 15:
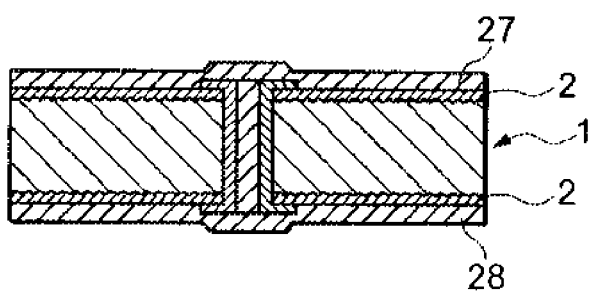
Figure 16:
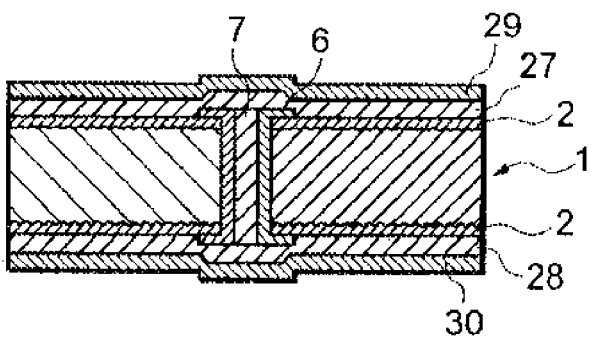
Figure 17:
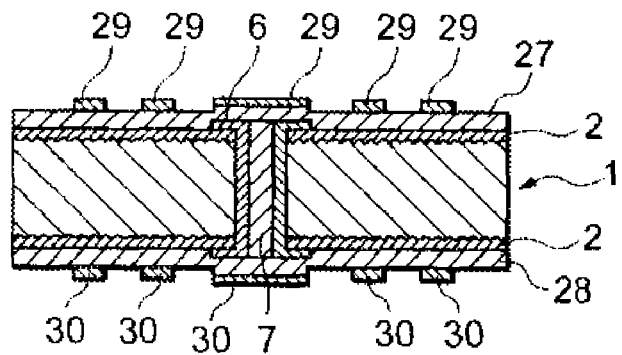

After curing the positive photosensitive resin 7, the surfaces are pickled and, as shown in FIG. 14, an electroless copper plating layer 25 is formed on the positive photosensitive resin 7 and the upper copper foil 2 by electroless copper plating, and an electroless copper plating layer 26 is formed on the positive photosensitive resin 7 and the lower copper foil 2 by electroless copper plating. After forming the electroless copper plating layers 25 and 26, as shown in FIG. 15, electrolytic copper plating layers 27 and 28 are formed on the electroless copper plating layers 25 and 26, respectively, by electrolytic copper plating. Incidentally, in the figures subsequent to FIG. 15 inclusive, the electroless copper plating layers 25 and 26 are omitted. After forming the electrolytic copper plating layers 27 and 28, the surfaces of the electrolytic copper plating layers 27 and 28 are subjected to soft etching using a sodium persulfate liquid. After the soft etching, as shown in FIG. 16, electrodeposited photoresists 29 and 30 are formed by electrodeposition on the electrolytic copper plating layers 27 and 28, respectively. After forming the electrodeposited photoresists 29 and 30, the electrodeposited photoresists 29 and 30 are exposed to ultraviolet light using a photomask (not illustrated). In this event, the intensity of ultraviolet light is, for example, about 700 mJ/cm². After the exposure, development is carried out to remove unnecessary parts of the electrodeposited photoresists 29 and 30 as shown in FIG. 17.

Figure 18:
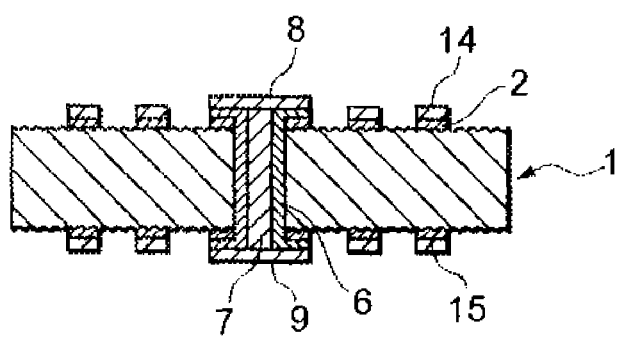
Figure 19:
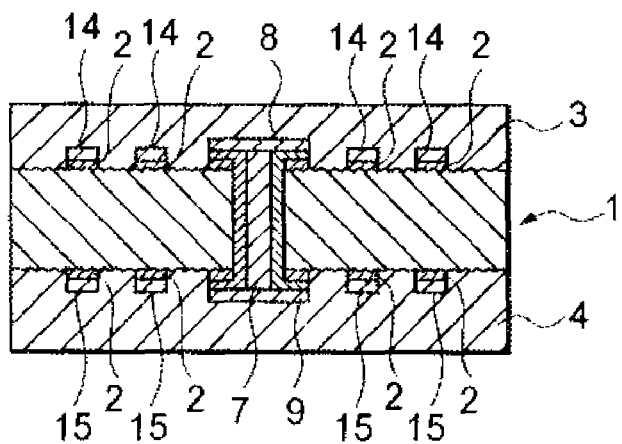
Figure 20:
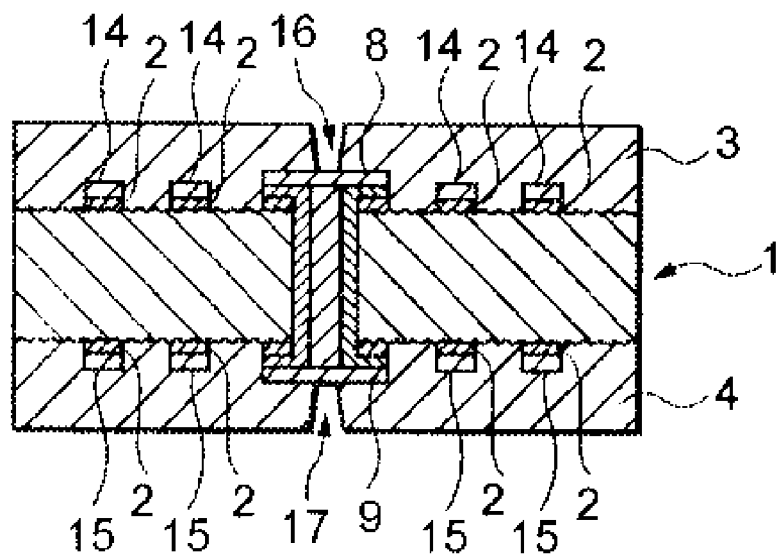
Figure 21:
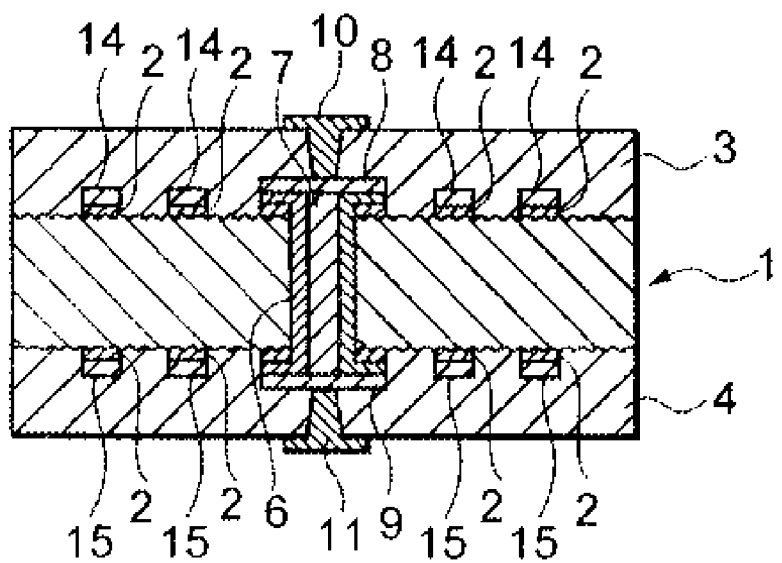

Subsequently, as shown in FIG. 18, the circuit patterns 14 and 15 are formed by etching and, simultaneously, the capped conductors 8 and 9 are also formed. After removing the electrodeposited photoresists 29 and 30, the insulating layers 3 and 4 are formed as shown in FIG. 19. After the formation thereof, as shown in FIG. 20, the via hole 16 is formed so as to extend from the surface of the insulating layer 3 to the capped conductor 8, while the via hole 17 is formed so as to extend from the surface of the insulating layer 4 to the capped conductor 9. After forming the via holes 16 and 17, an electroless copper plating layer (not illustrated) is formed by electroless copper plating on the surface of the via hole 16 and the surface of the insulating layer 3 in the vicinity of the opening of the via hole 16, then, as shown in FIG. 21, the via conductor 10 is formed thereon. In the same manner, the via conductor 11 is formed on the surface of the via hole 17 and the surface of the insulating layer 4 in the vicinity of the opening of the via hole 17. The via conductors 10 and 11 are formed by electrolytic copper plating.

In the manufacturing method for the printed wiring board according to this embodiment, the positive photosensitive resin 7 is used as the resin filled inside the through hole 5 where the through hole conductor 6 is formed. In this case, the exposed resin is removed by the development step. Since the positive photosensitive resin 7 filled inside the through hole 5 is not exposed, it is not removed by the development step. Further, by adjusting the energy of ultraviolet light upon exposure, it is possible to control a light reaction depth in a resin. Therefore, by changing the energy of ultraviolet light upon exposure at the part of the positive photosensitive resin 7 filled inside the through hole 5 and the other part (part formed on the openings of the through hole 5 and the surfaces of the copper-clad laminate board 1 in the vicinity of the openings thereof), the unnecessary part of the positive photosensitive resin 7 can be easily removed. Consequently, it is possible to fill the through hole 5 with the resin using either the screen printing method or the lamination method and then easily remove the unnecessary part of the resin without abrading the resin.

Further, upon forming the through hole conductor 6 in the through hole 5, the photoresists are formed on the surfaces of the copper-clad laminate board 1 except the surface of the through hole 5 and the surfaces of the copper-clad laminate board 1 in the vicinity of the openings of the through hole 5 as shown in FIG. 6, and therefore, the copper plating layer is not formed in the region other than the through hole conductor 6. Consequently, each of the circuit patterns 14 and 15 can be formed to have a thickness that is smaller than the thickness T of the circuit pattern 90 of the conventional printed wiring board (see FIG. 47D). This is due to the portion corresponding to the copper plating layer 74 in the conventional circuit pattern 90 is not formed in the circuit patterns 14 and 15 of the present invention. Thus, the design accuracy of the circuit pattern can be ensured.

As described above, each of the circuit patterns 14 and 15 of the present invention does not include the portion corresponding to the copper plating layer 74 in the conventional circuit pattern 90. Conventionally, since the copper plating layer 74 is formed, the copper plating layer 75 formed thereafter simultaneously with capped conductor 52 should be thin (FIG. 47D). In this embodiment of the present invention, however, the capped conductors 8 and 9 formed simultaneously with the circuit patterns 14 and 15 can be formed to be thicker than the conventional capped conductor 52. Inasmuch as the capped conductors 8 and 9 can be formed to be thick, deformation caused by differences in the thermal expansion coefficients among the positive photosensitive resin 7, the through hole conductor 6, and the copper-clad laminate board 1 can be relaxed by the capped conductors 8 and 9 so that an influence of the deformation exerted on the via conductors 10 and 11 can be reduced.

In the printed wiring board 100 according to the embodiment described hereinabove with reference to FIG. 1, the circuit patterns 14 and 15 are formed by the subtractive method. However, the circuit patterns 14 and 15 can also be formed using the additive method.

Figure 22:
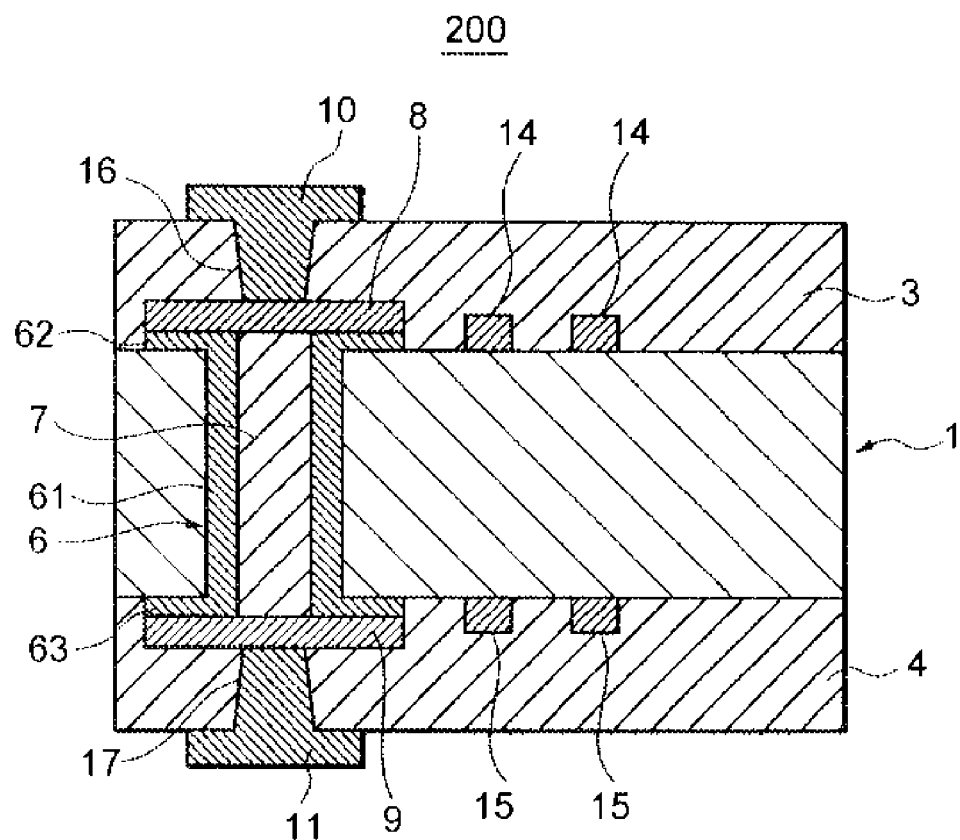
FIG. 22 is a sectional view showing a structure of a printed wiring board according to another embodiment of the present invention.

Referring to FIG. 22, a printed wiring board 200 differs from the printed wiring board 100 in that copper foils 2 on the surfaces of a copper-clad laminate board 1 are removed. The other structures are the same as those shown on the printed wiring board 100.

Figure 23:
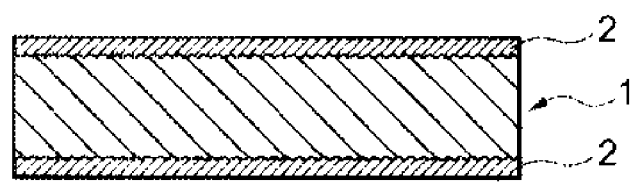
FIGS. 23-43 are sectional views showing a first process in a manufacturing method for the printed wiring board shown in FIG. 22.
Figure 24:
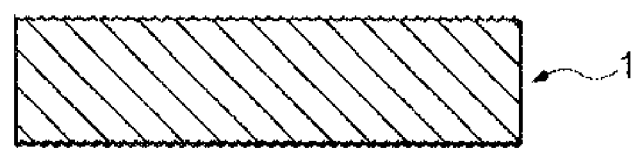
Figure 25:
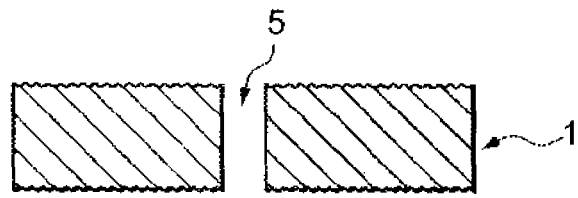
Figure 26:
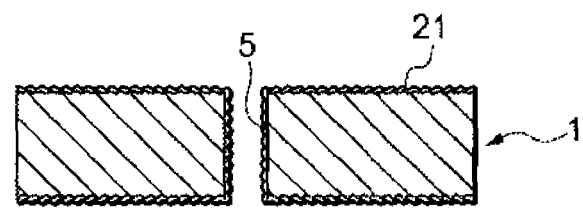
Figure 27:
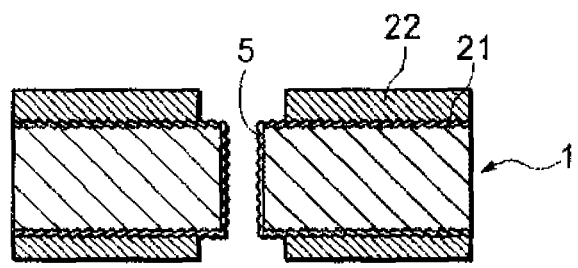
Figure 28:
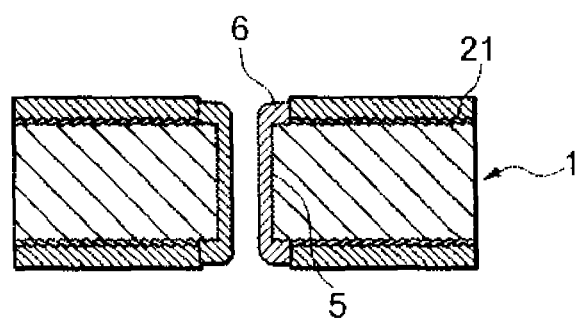
Figure 29:
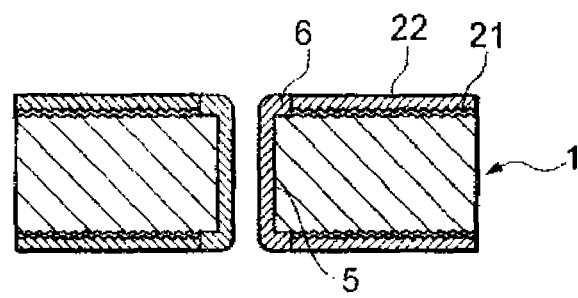
Figure 30:
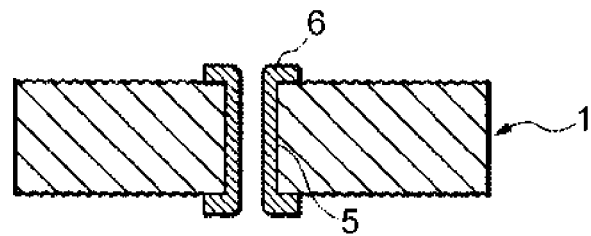
Figure 31:
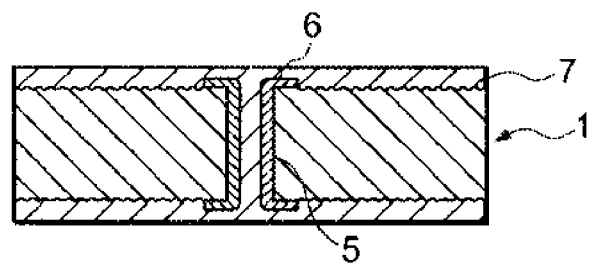
Figure 32:
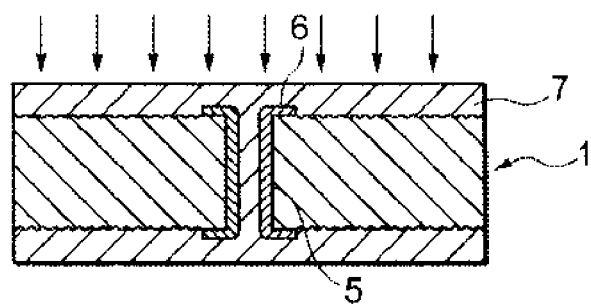
Figure 33:
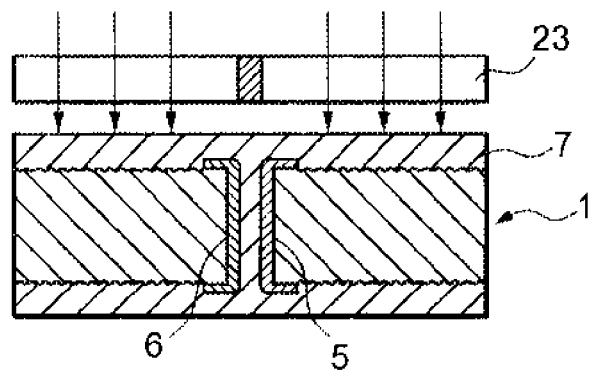
Figure 34:
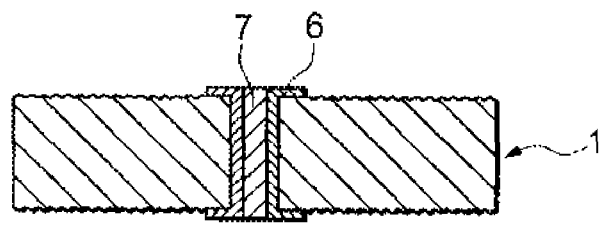
Figure 35:
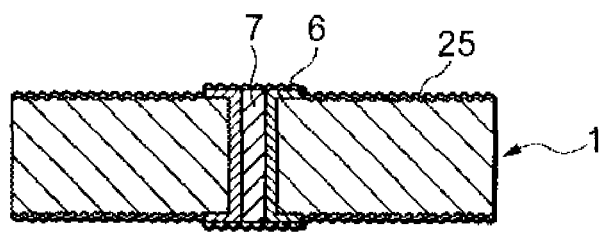

Description will be made of a method of manufacturing the printed wiring board 200 having the foregoing structure and manufactured by a semi-additive method. FIGS. 23 to 43 are sectional views for describing the manufacturing method for the printed wiring board 200 shown in FIG. 22. The copper-clad laminate board 1 as shown in FIG. 23 is provided. A thickness of each copper foil 2 is, for example, about 18 μm. Subsequently, as shown in FIG. 24, the copper foils 2 formed on upper and lower surfaces of the copper-clad laminate board 1 are removed by etching. Removal of the copper foils 2 produces unevenness on the surfaces of the copper-clad laminate board 1. A difference in height between a concave portion and a convex portion is, on average, about 7 μm. Since a surface area increases by the unevenness, an anchor effect is generated. Owing to the generation of the anchor effect, even if circuit patterns are formed by the semi-additive method, it is possible to tightly adhere the circuit patterns to the copper-clad laminate board 1 with the copper foils 2 removed therefrom. As an etching liquid, a copper chloride aqueous solution, for example, is used. The difference in height between the concave portion and the convex portion is preferably about 4 μm or more, and more preferably about 7 μm.

A process of forming a through hole 5 in the copper-clad laminate board 1 after etching to process steps of filling the through hole 5 with a positive photosensitive resin 7 and then forming electroless copper plating layers 25 and 26 (FIGS. 25 to 35) are the same as the process steps described with reference to FIGS. 4 to 14.

Figure 36:
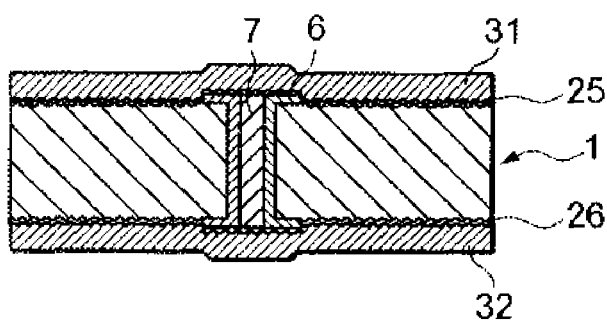
Figure 37:
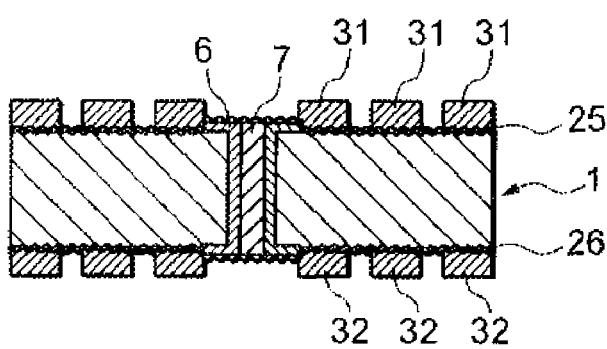

Process steps shown in FIGS. 36 to 42 are for forming the circuit patterns 14 and 15 by the semi-additive method. Referring to FIG. 36, after the formation of the electroless copper plating layers 25 and 26, dry film photoresists 31 and 32 are formed on the surfaces of the electroless copper plating layers 25 and 26. The dry film photoresists 31 and 32 are negative photoresists that are developed by an alkaline solution, and are formed on the electroless copper plating layers 25 and 26 by the lamination method. After forming the dry film photoresists 31 and 32, the dry film photoresists 31 and 32 are exposed to ultraviolet light and developed, as shown in FIG. 37, using a photomask for forming the circuit patterns 14 and 15. The intensity of ultraviolet light upon the exposure is, for example, about 200 mJ/cm$^2$. As a developer, a sodium carbonate solution, for example, is used.

Figure 38:
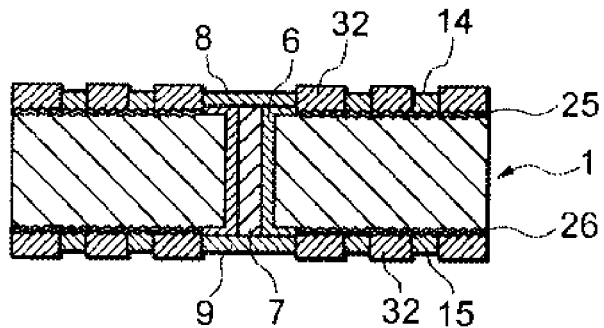
Figure 39:
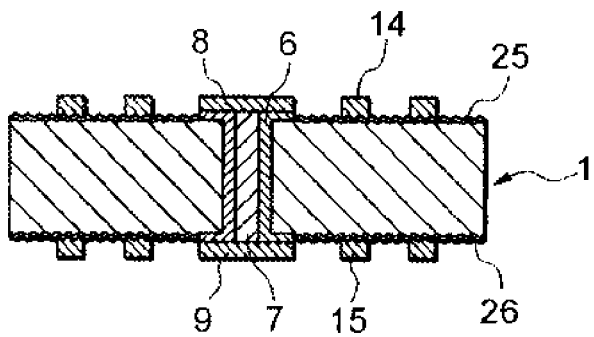
Figure 40:
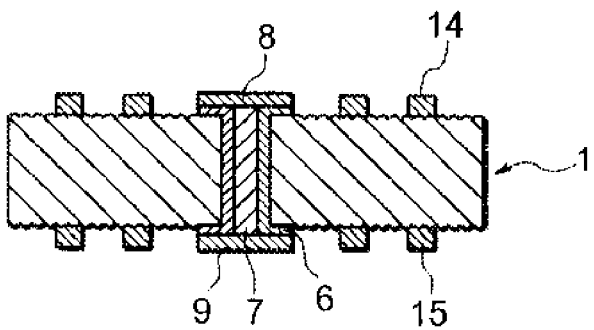
Figure 41:
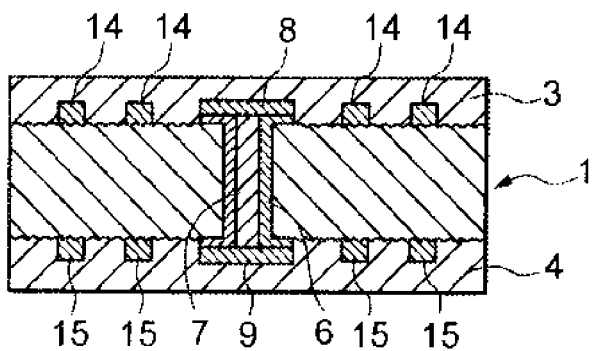
Figure 42:
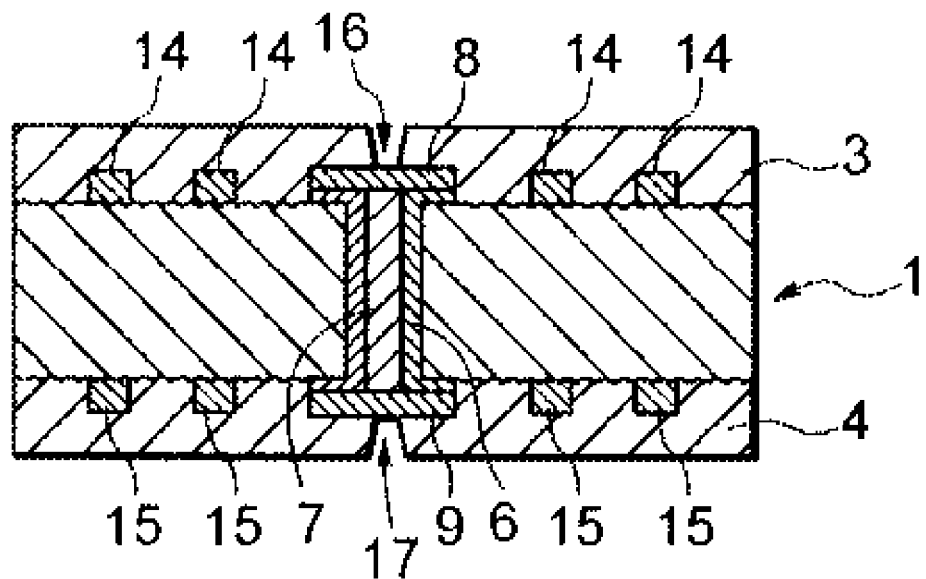
Figure 43:
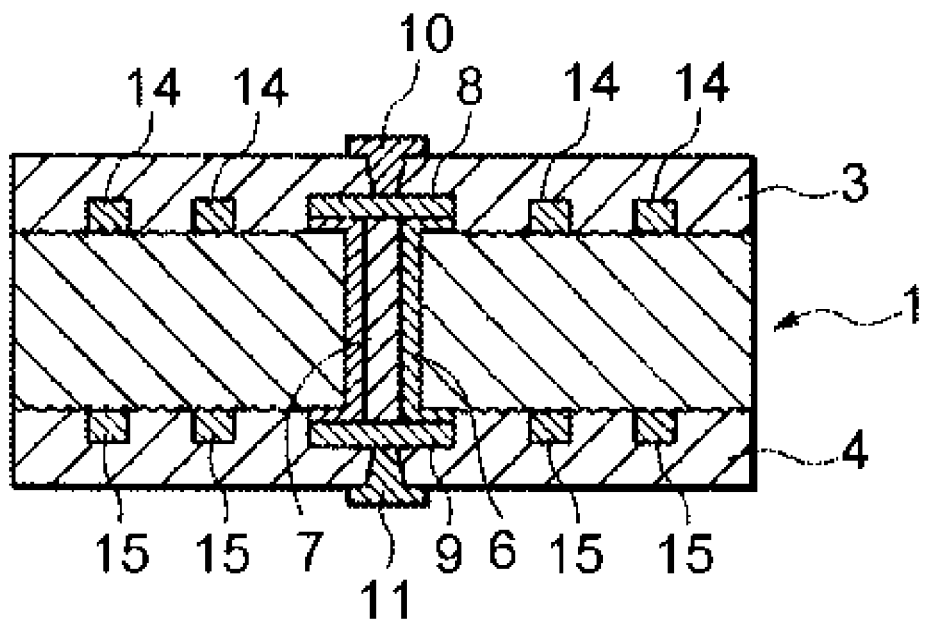
Figure 44A:
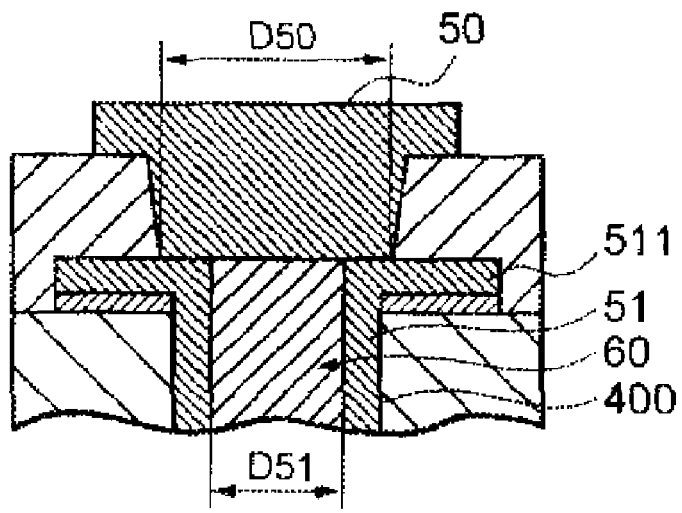
FIGS. 44A-44C are sectional views showing structures of conventional printed wiring boards.
Figure 44B:
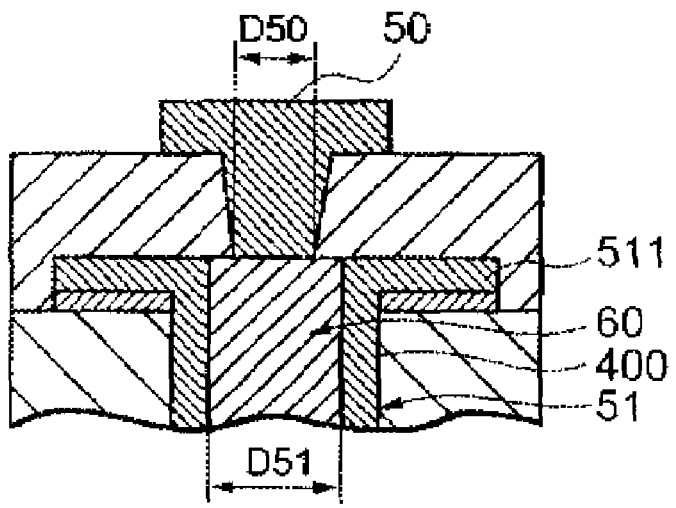
Figure 44C:
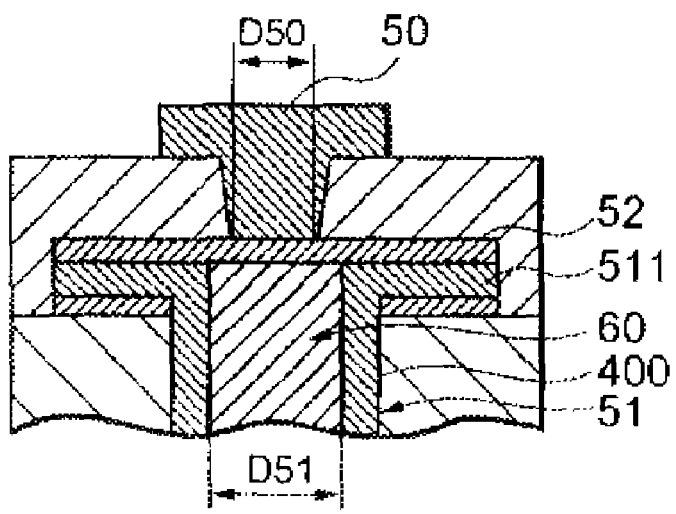
Figure 45:
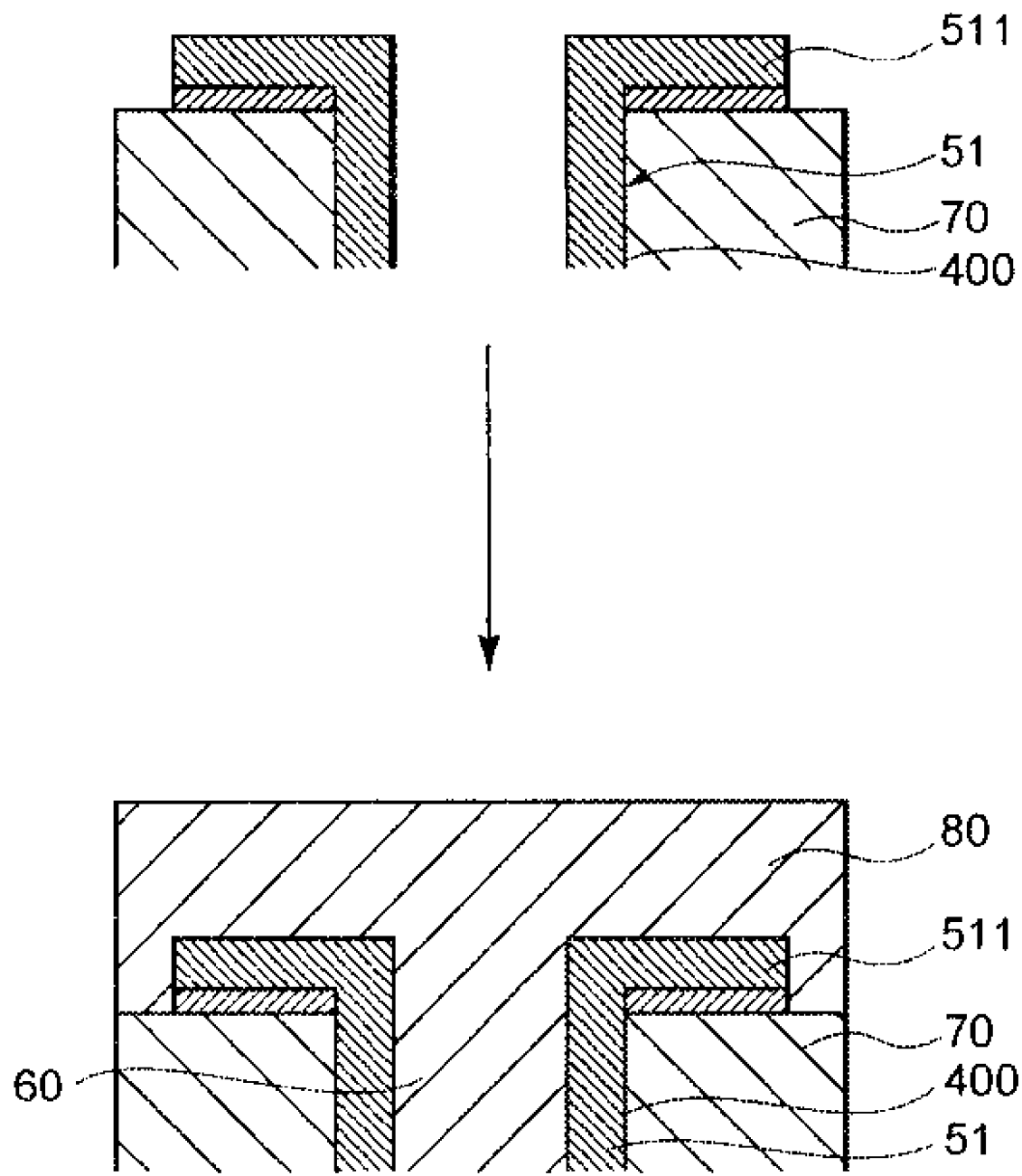
FIG. 45 is a sectional view showing a process of filling a through hole with a resin using the lamination method.
Figure 46A:
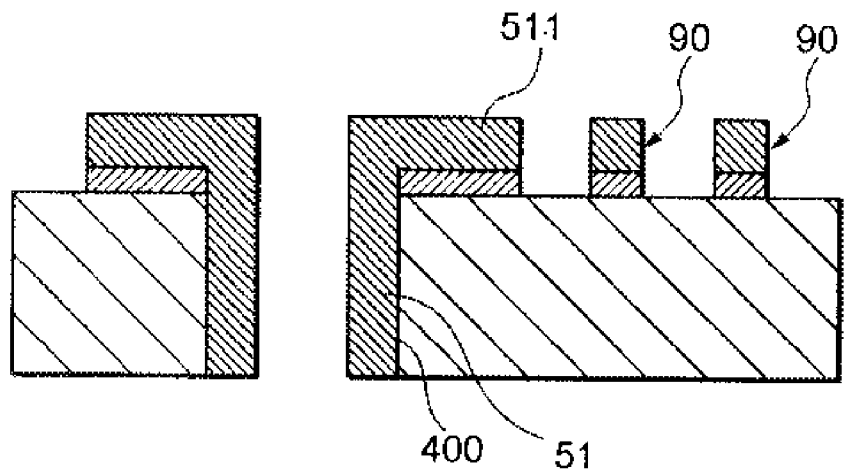
FIGS. 46A-46C are sectional views showing manufacturing processes of a printed wiring board when forming a circuit pattern using the additive method in the case when a through hole is filled with a resin by the screen printing method.
Figure 46B:
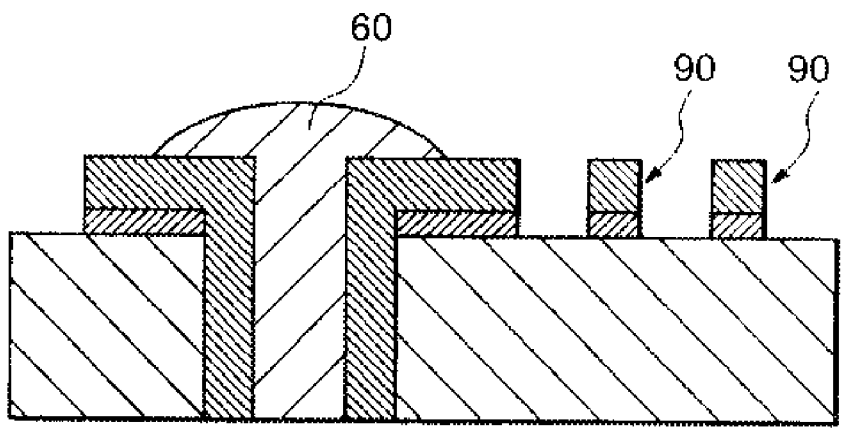
Figure 46C:
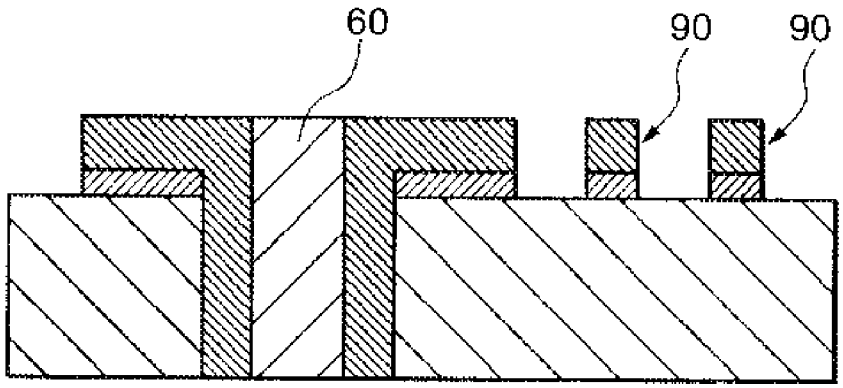

Subsequently, as shown in FIG. 38, the circuit patterns 14 and 15 are formed by electrolyte copper plating. Each of the circuit patterns 14 and 15 is formed by an electrolyte copper plating layer. In this event, the capped conductors 8 and 9 are also formed. Incidentally, in the figures subsequent to FIG. 38 inclusive, the electroless copper plating layers 25 and 26 formed on the surfaces of the through hole conductor 6 are omitted. After the formation, the dry film photoresists 31 and 32 are removed as shown in FIG. 39, and further, the electroless copper plating layers 25 and 26 that appeared are removed by flash etching as shown in FIG. 40. As an etching liquid, a sodium persulfate liquid is used. Although not shown in FIG. 40, the electroless copper plating layers 25 and 26 remain between the circuit patterns 14 and 15 and the copper-clad laminate board 1. Subsequent processes (FIGS. 41 to 43) are the same as the processes described with reference to FIGS. 19 to 21.

Through the foregoing manufacturing processes, the printed wiring board can be manufactured even by the additive method. This is because when the through hole 5 where the through hole conductor 6 is formed is filled with the resin, unnecessary resin can be easily removed by the exposure and development steps.

While the invention has been described above with reference to preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A method of manufacturing a printed wiring board, comprising:
    providing a base substrate;
    forming a through hole in said base substrate;
    forming a first conductor layer on a surface of said through hole and a surface of said base substrate in the vicinity of an opening of said through hole;
    filling said through hole where said first conductor layer is formed with a photosensitive resin and forming the photosensitive resin on the opening of said through hole where said first conductor layer is formed and on a surface of said base substrate at least in the vicinity of said opening;
    performing a first exposure of said photosensitive resin at a first intensity to expose an upper portion of said photosensitive resin without exposing photosensitive resin located within said through hole;
    masking an area substantially above the opening of said through hole;
    performing a second exposure of unmasked photosensitive resin at a second intensity different than said first intensity;
    removing said exposed photosensitive resin; and
    forming a second conductor layer covering the photosensitive resin filled inside said through hole and coupling said second conductor layer to said first conductor layer.

2. The method according to claim 1, wherein forming said first conductor layer further comprises:
    forming a photoresist on the surface of said base substrate except the surface of said through hole and the surface of said base substrate in the vicinity of the opening of said through hole;
    forming said first conductor layer by plating on the surface of said through hole and the surface of said base substrate in the vicinity of the opening of said through hole; and
    removing said photoresist after forming said first conductor layer.

3. The method according to claim 1 further comprising forming a circuit pattern on the surface of said base substrate after removing said photosensitive resin.

4. The method according to claim 3, wherein forming a circuit pattern is carried out simultaneously with forming said second conductor layer.

5. The method according to claim 1, wherein said photosensitive resin is a positive photosensitive resin.

6. The method according to claim 1, further comprising:
    forming an insulating layer on the surface of said base substrate so as to cover said second conductor layers-forming a via hole in said insulating layer, said via hole extending to reach said second conductor layer; and
    forming a via conductor covering a surface of said insulating layer at least in the vicinity of an opening of said via hole and coupled to said second conductor layer.

7. The method according to claim 1, wherein said first conductor layer comprises copper and said second conductor layer comprises copper.

8. The method according to claim 1, wherein the first and second exposures comprise an ultraviolet photolithographic process.

9. The method according to claim 1, wherein said base substrate comprises a copper-clad laminate board.

10. The method according to claim 1, wherein said first conductor layer forms a through hole conductor and said second conductor layer forms a capped conductor.

11. The method according to claim 1, wherein said photosensitive resin filled inside said through hole is heat cured.

12. The method according to claim 1, wherein said second intensity is greater than said first intensity.

13. The method according to claim 1, wherein said exposed photosensitive resin is removed through development.

* * * * *